United States Patent
Mo et al.

(10) Patent No.: US 9,728,739 B2
(45) Date of Patent: Aug. 8, 2017

(54) ORGANIC LIGHT-EMITTING DEVICE AND MANUFACTURING METHOD THEREFOR

(71) Applicant: LG DISPLAY CO., LTD., Seoul (KR)

(72) Inventors: Sung Ho Mo, Daejeon (KR); Munsup Chung, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/910,226

(22) PCT Filed: Sep. 30, 2014

(86) PCT No.: PCT/KR2014/009241
§ 371 (c)(1),
(2) Date: Feb. 4, 2016

(87) PCT Pub. No.: WO2015/047056
PCT Pub. Date: Apr. 2, 2015

(65) Prior Publication Data
US 2016/0181571 A1    Jun. 23, 2016

(30) Foreign Application Priority Data
Sep. 30, 2013  (KR) ........................ 10-2013-0116192

(51) Int. Cl.
H01L 51/52    (2006.01)
H01L 27/32    (2006.01)

(52) U.S. Cl.
CPC ...... *H01L 51/5243* (2013.01); *H01L 27/3244* (2013.01); *H01L 51/5203* (2013.01);
(Continued)

(58) Field of Classification Search
None
See application file for complete search history.

(56) References Cited

U.S. PATENT DOCUMENTS 5,725,909 A * 3/1998 Shaw ........................ B05D 1/60
                                                    427/223
6,867,539 B1 * 3/2005 McCormick ........ H01L 51/5253
                                                    257/40
(Continued)

FOREIGN PATENT DOCUMENTS

EP    1093166 A2    4/2001
JP    2002-008856 A    1/2002
(Continued)

OTHER PUBLICATIONS

Machine Translation of KR 2003 0083529.*
Boroson, M., et. al. 'Flexible OLEDs on Corning Willow Glass', OLEDWorks.com, Mar. 1, 2016.*

*Primary Examiner* — Joseph Schoenholtz
(74) *Attorney, Agent, or Firm* — Dentons US LLP

(57) ABSTRACT

The present invention relates to an organic light emitting device and a method of preparing the same. More particularly, the organic light emitting device according to the present invention includes: a substrate; an organic light emitting unit in which a first electrode, an organic material layer, and a second electrode are sequentially stacked on the substrate; and an encapsulating unit configured to seal an external side of the organic light emitting unit, in which a protecting unit is provided on at least a partial region of the substrate, on which the organic light emitting unit and the encapsulating unit are not provided, and at least a partial region in a lateral surface region of the substrate.

18 Claims, 2 Drawing Sheets

(52) U.S. Cl.
CPC ........ *H01L 51/524* (2013.01); *H01L 51/5253* (2013.01); *H01L 51/5268* (2013.01); *H01L 2251/5338* (2013.01); *H01L 2251/558* (2013.01)

(56) References Cited

U.S. PATENT DOCUMENTS

| | | |
|---|---|---|
| 2003/0017297 A1 | 1/2003 | Song et al. |
| 2003/0184219 A1 | 10/2003 | Duggal et al. |
| 2005/0012445 A1 | 1/2005 | Yamazaki et al. |
| 2005/0023965 A1 | 2/2005 | Maeda et al. |
| 2005/0136625 A1* | 6/2005 | Henseler ............... B32B 7/06 438/479 |
| 2006/0278965 A1 | 12/2006 | Foust et al. |
| 2008/0018244 A1* | 1/2008 | Anandan ............ H01L 51/5243 313/511 |
| 2010/0052503 A1 | 3/2010 | Fukagawa |
| 2011/0024779 A1* | 2/2011 | Nakamura ............ B82Y 20/00 257/98 |
| 2011/0070672 A1 | 3/2011 | Lee et al. |
| 2011/0101853 A1 | 5/2011 | Lee et al. |
| 2012/0146493 A1 | 6/2012 | Ra |
| 2012/0223635 A1* | 9/2012 | Mochizuki ........ H01L 51/5268 313/512 |
| 2013/0101754 A1 | 4/2013 | Shimomura et al. |
| 2013/0181242 A1 | 7/2013 | Cho |
| 2014/0034994 A1 | 2/2014 | Yamane et al. |
| 2014/0049742 A1 | 2/2014 | Misono |
| 2014/0145587 A1* | 5/2014 | Yoon ................... H01L 21/6835 313/512 |
| 2014/0190565 A1* | 7/2014 | Jung ..................... H01L 51/107 136/259 |
| 2014/0299844 A1* | 10/2014 | You ..................... H01L 51/5246 257/40 |
| 2014/0322526 A1* | 10/2014 | Dollase ................. C03C 27/10 428/337 |
| 2014/0353656 A1 | 12/2014 | Nakamura |
| 2016/0064688 A1* | 3/2016 | Osaki ................. H01L 51/5253 257/40 |

FOREIGN PATENT DOCUMENTS

| | | | |
|---|---|---|---|
| JP | 2003-243155 A | | 8/2003 |
| JP | 2011-29022 A | | 2/2011 |
| JP | 2011-171128 A | | 9/2011 |
| JP | 2012-155177 A | | 8/2012 |
| JP | 2013-021357 A | | 1/2013 |
| JP | 2013-186984 A | | 9/2013 |
| KR | 10-2002-0030730 A | | 4/2002 |
| KR | 10-2003-0083529 A | | 10/2003 |
| KR | 20030083529 A | * | 10/2003 |
| KR | 10-2012-0062191 A | | 6/2012 |
| KR | 10-2012-0074062 A | | 7/2012 |
| KR | 10-2013-0053038 A | | 5/2013 |
| WO | 2012/147322 A1 | | 11/2012 |
| WO | 2013046545 A1 | | 4/2013 |
| WO | 2013-094617 A | | 6/2013 |
| WO | 2015/047056 A1 | | 4/2015 |

* cited by examiner

ORGANIC LIGHT-EMITTING DEVICE AND MANUFACTURING METHOD THEREFOR

TECHNICAL FIELD

This application is a National Stage Entry of International Application No. PCT/KR2014/009241, filed Sep. 30, 2014, and claims the benefit of Korean Application No. 10-2013-0116192, filed on Sep. 30, 2013, all of which are hereby incorporated by reference in their entirety for all purposes as if fully set forth herein.

The present invention relates to an organic light emitting device and a method for preparing the same.

BACKGROUND ART

An organic light emitting device is a device, in which holes and electrons are injected to an emission layer formed between electrodes through the electrode, so that the injected holes and electrons form excitons to emit light while disappearing.

Since the organic light emitting device has a self-emission property, the organic light emitting device has an advantage in view of a small thickness, lower power consumption, a more excellent viewing angle, and a higher response speed than those of a liquid crystal display in the related art.

Further, compared to a plasma display panel or an inorganic EL panel display, the organic light emitting device has an advantage in that the organic light emitting device is drivable at 10 V or lower, which is a lower voltage, has low power consumption, and excellent color expression. In addition, the organic light emitting device may also be prepared by using a plastic substrate having a flexible property.

Further, the organic light emitting device is divided into a passive organic light emitting device and an active organic light emitting device. The passive organic light emitting device adopts a bottom emission type of emitting light generated in an emission layer toward a surface of a substrate. In the meantime, when the active organic light emitting device adopts the bottom emission type, the organic light emitting device is hidden by a thin film transistor (TFT), so that an aperture ratio is decreased. Accordingly, in order to increase an aperture ratio, a top emission type for emitting light to an opposite side of a substrate has been demanded.

In an encapsulation method and an encapsulation structure of the organic light emitting device having the aforementioned excellent advantages in the related art, a substrate, on which an emission body including a first electrode, a second electrode, and an emission layer is positioned, and an encapsulation cap for encapsulating the substrate are generally encapsulated by using a thermosetting or photo-curable adhesive member.

DETAILED DESCRIPTION OF THE INVENTION

Technical Problem

Research on an organic light emitting device having an excellent encapsulation property is necessary in the present technical field.

Technical Solution

The present application provides an organic light emitting device, including: a substrate; an organic light emitting unit in which a first electrode, an organic material layer, and a second electrode are sequentially stacked on the substrate; and an encapsulating unit configured to seal an external side of the organic light emitting unit, in which a protecting unit is provided on at least a partial region of the substrate, on which the organic light emitting unit and the encapsulating unit are not provided, and at least a partial region in a lateral surface region of the substrate.

Further, the present application provides a lighting device including the organic light emitting device.

Further, the present application provides a display device including the organic light emitting device.

Advantageous Effects

The organic light emitting device according to the exemplary embodiment of the present application includes the protecting unit in the region of the region on the thin glass substrate, on which the organic emitting unit and the encapsulating unit are not provided, and the lateral surface region of the substrate, thereby protecting the thin glass substrate from exposure to the outside, and thus enhancing strength of an organic light emitting device product.

BEST MODE

Hereinafter, the present invention will be described in detail.

An encapsulation process among the OLED techniques is a core technique dominating a lifespan and reliability of the OLED, and a material of the OLED is very vulnerable to moisture and oxygen, so that there may occur various problems in that, when moisture or oxygen permeates, the moisture or oxygen causes deformation and a decrease in a lifespan of an organic material layer and an electrode. Accordingly, the OLED absolutely requires the encapsulation process for blocking external air from permeating therein.

Figure 1:
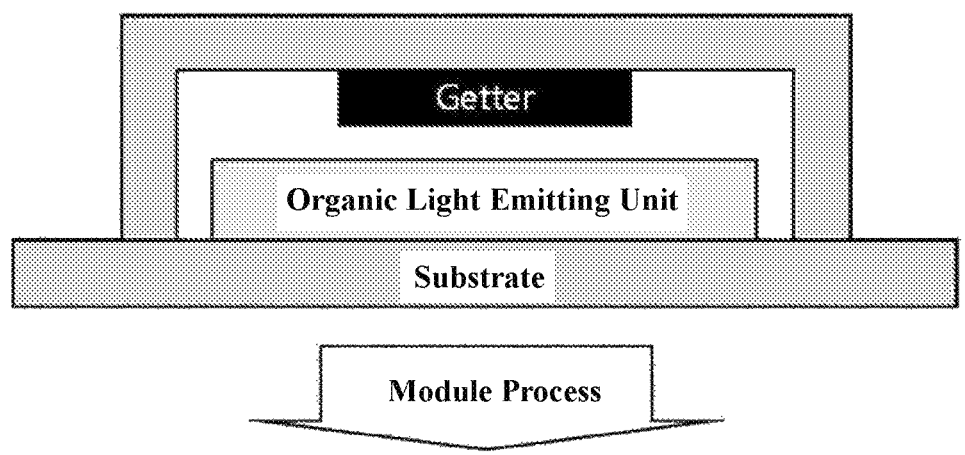
FIG. 1 is a view schematically illustrating an organic light emitting device in the related art.
Figure 1:
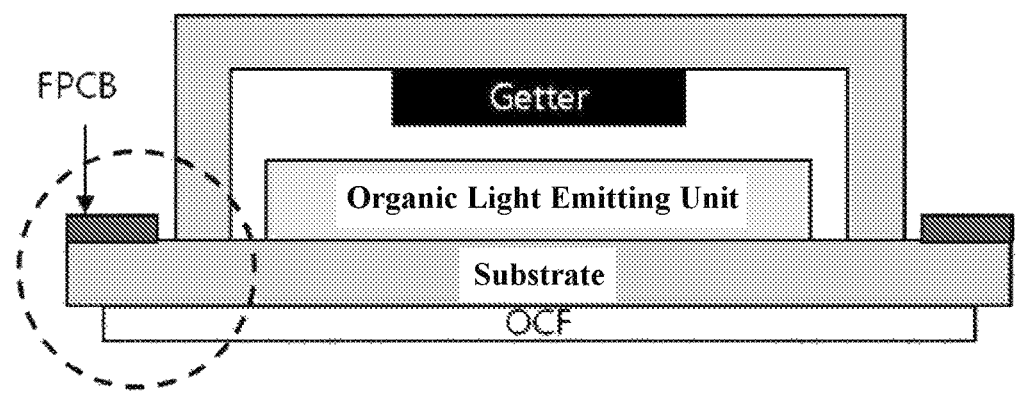

An organic light emitting device in the related art is schematically illustrated in FIG. 1 below. In the organic light emitting device in the related art, an organic light emitting unit including a first electrode, an organic material layer, and a second electrode is provided on a glass substrate, and an encapsulating unit for sealing an external side of the organic light emitting unit is included. In order to electrically connect the first electrode and the second electrode of the organic light emitting device with an external power source, a module processing is performed, and a flexible printed circuit board (FPCB) is generally provided on the glass substrate which not provided with the organic light emitting unit and the encapsulating unit. Further, an out coupling film (OCF) is provided under the glass substrate. The OCF, which is a kind of diffusion film, may serve to improve light efficiency by making light generated inside the device be efficiently emitted to the outside by relieving a total reflection condition of light. A material known in the art may be used for the OCF.

The FPCB is designed to be small compared to a width of a pad by reflecting work tolerance, and the OCF is designed to be smaller than an area of the glass substrate by reflecting work tolerance.

In the related art, when a thin glass substrate is used as a glass substrate of the organic light emitting device, the thin glass substrate is exposed to the outside, and thus, there may occur a phenomenon in that the thin glass substrate brakes when an organic light emitting device product is treated.

Accordingly, in the present application, research on a process for protecting the thin glass substrate when the thin glass substrate is used as a substrate of the organic light emitting device has been conducted, thereby completing the present invention.

An organic light emitting device according to an exemplary embodiment of the present invention includes: a substrate; an organic light emitting unit, in which a first electrode, an organic material layer, and a second electrode are sequentially stacked on the substrate; and an encapsulating unit for sealing an external side of the organic light emitting unit, in which a protecting unit is provided on at least a partial region of the substrate, on which the organic light emitting unit and the encapsulating unit are not provided, and at least a partial region in a lateral surface region of the substrate.

In the present application, the substrate may be a thin glass substrate. A thickness of the thin glass substrate may be 0.1 mm or lower, and 50 to 100 µm, but is not limited thereto.

In the present application, the protecting unit may be provided over an entire region on the substrate, on which the organic light emitting unit and the encapsulating unit are not provided, and an entire region of the lateral surface region of the substrate.

Further, the protecting unit may be additionally provided over the entire region of an upper region and a lateral surface region of the encapsulating unit.

That is, the protecting unit may be provided on all external sides of the substrate and the encapsulating unit of the organic light emitting device.

In the present application, an OCF having a wider area than that of the substrate may be additionally provided under the substrate. In this case, the organic light emitting device may have a structure in which the substrate having the smaller area than that of the OCF is provided on the OCF, and the protecting unit may be additionally provided on a region of the OCF, on which the substrate is not provided.

In the present application, the protecting unit may serve to physically protect the thin glass substrate, which is exposed to the outside, and serve as a barrier for preventing external moisture, air, and the like from permeating into the thin glass substrate.

In the present application, the protecting unit may include a plastic film. The plastic film may be selected from the group consisting of polyimide, polyethylene terephthalate (PET), polyester, polycarbonate (PC), polyethylene naphthalate (PEN), polyether ether ketone (PEEK), polyarylate (PAR), polycyclicolefin (PCO), polynorbornene, polyethersulphone (PES), and cycloolefin polymer (COP), but is not limited thereto.

In the present application, the protecting unit may include an insulating layer and a metal pattern layer. Further, the protecting unit may include a two-layered insulating layer, and a metal pattern layer provided between the two-layered insulating layer.

The insulating layer may include polyimide, but is not limited thereto. A thickness of the insulating layer may be 1 to 50 µm and 5 to 20 µm, but is not limited thereto.

The metal pattern layer may serve as a barrier for preventing external moisture, air, and the like from permeating into the organic light emitting unit.

In the present application, the first electrode or the second electrode may be electrically connected with an external power source through the metal pattern layer. More particularly, the metal pattern layer may include a first metal pattern for electrically connecting the first electrode and the external power source, and a second metal pattern for electrically connecting the second electrode and the external power source. Further, in the present application, the metal layer may include both the first metal pattern and the second metal pattern.

The metal pattern layer may be formed by laminating a precut metal pattern on the insulating layer, or forming a metal layer by depositing the metal layer on the insulating layer and the patterning the metal layer.

A thickness of the metal pattern layer may be 1 nm to 50 µm and 5 to 20 µm, but is not limited thereto.

The metal pattern layer may include one or more of copper, aluminum, iron, magnesium, calcium, sodium, potassium, titanium, indium, yttrium, lithium, gadolinium, platinum, gold, tungsten, tantalum, silver, tin, and lead, but is not limited thereto.

In the present application, the protecting unit may include a contact hole for electrically connecting the first electrode or the second electrode with the external power source. The contact hole may be formed by using a method known in the art. Further, in order to electrically connect the first electrode or the second electrode with the external power source, the contact hole may include a conductive paste therein. The conductive paste may include one or more selected from Ag, Au, Cu, Ni, Al, W, Co, Pd, and an alloy thereof, but is not limited thereto.

In the present application, the protecting unit may additionally include an anisotropic conductive film for electrically connecting the first electrode or the second electrode with the external power source. A thermosetting resin film including a conductive ball formed of small conductive particles may be used as the anisotropic conductive film.

In the present application, the encapsulating unit may include a sealing layer, which is in contact with the external side of the organic light emitting unit, and a metal layer provided on the sealing layer.

The sealing layer may use a face seal film. The face seal film may be an adhesive film including a getter. The getter is a material for absorbing residual gas or preparing a compound with the residual gas, and the type of getter is not limited as long as the getter is capable of absorbing moisture or oxygen included on the adhesive film and left, or preparing a compound by reacting with the residual moisture or oxygen, but the getter may be at least one among, for example, activated carbon, barium, magnesium, zirconium, and red phosphorus.

Further, the metal layer may include one or more of copper, aluminum, iron, magnesium, calcium, sodium, potassium, titanium, indium, yttrium, lithium, gadolinium, platinum, gold, tungsten, tantalum, silver, tin, and lead, but is not limited thereto.

Figure 2:
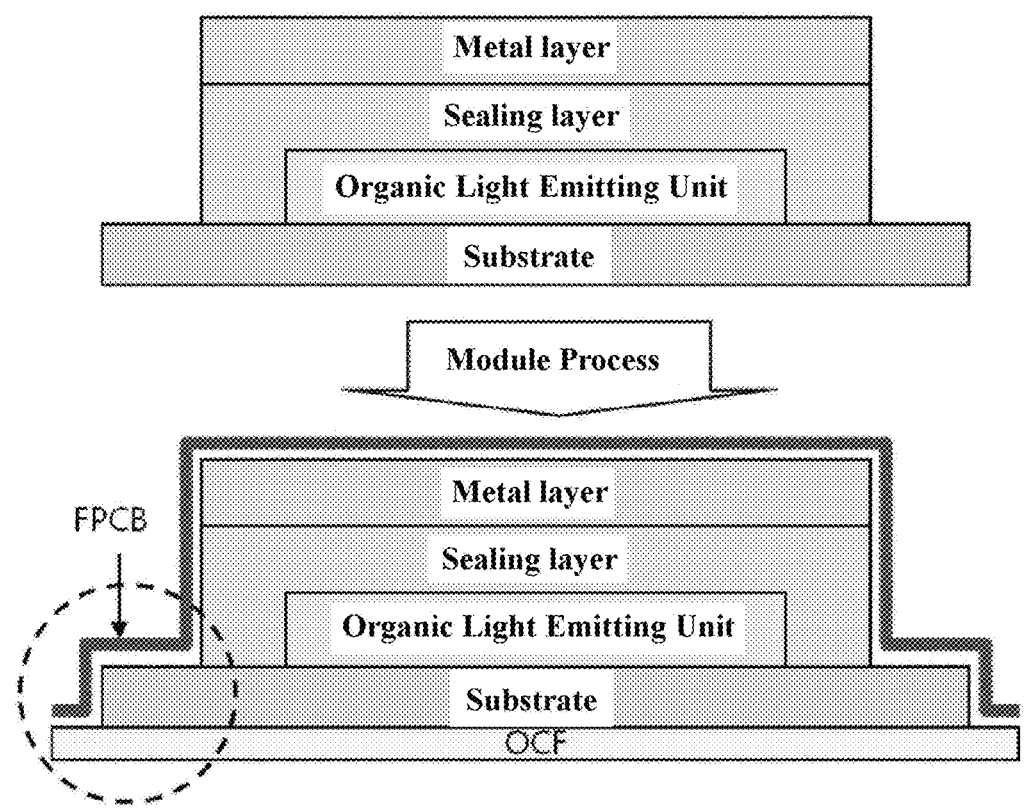
FIG. 2 is a view schematically illustrating an organic light emitting device according to an exemplary embodiment of the present application.

The organic light emitting device according to the exemplary embodiment of the present invention is schematically illustrated in FIG. 2.

In the present application, the organic light emitting unit may include an anode, one or more layered organic material layers, and a cathode.

The anode may be formed of one or more selected from magnesium, calcium, sodium, potassium, titanium, indium, yttrium, lithium, gadolinium, aluminum, platinum, gold, tungsten, tantalum, copper, silver, tin and lead.

In addition, the anode may also be formed of a transparent conductive oxide. Here, the transparent conductive oxide may be at least one oxide selected from indium (In), tin (Sn), zinc (Zn), gallium (Ga), cerium (Ce), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), aluminum (Al) and lanthanum (La).

The anode may be formed by using any one physical vapor deposition (PVD) selected from sputtering, E-beam evaporation, thermal evaporation, laser molecular beam epitaxy (L-MBE), and pulsed laser deposition (PLD); any one chemical vapor deposition selected from thermal chemical vapor deposition, plasma-enhanced chemical vapor deposition (PECVD), light chemical vapor deposition, laser chemical vapor deposition, metal-organic chemical vapor deposition (MOCVD), and hydride vapor phase epitaxy (HVPE); or atomic layer deposition (ALD).

An auxiliary electrode may be additionally included in order to improve the resistance of the anode. The auxiliary electrode may be formed by a process of depositing or printing one or more selected from the group consisting of a sealant and a metal. More specifically, the auxiliary electrode may include Cr, Mo, Al, Cu, an alloy thereof or the like, but is not limited thereto.

The insulating layer may be additionally included on the auxiliary electrode. The insulating layer may be formed by using a material and a method known in the art. More specifically, the insulating layer may be formed by using a general photoresist material, polyimide, polyacryl, a silicon nitride, a silicon oxide, an aluminum oxide, an aluminum nitride, an alkali metal oxide, an alkaline earth metal oxide, and the like, but is not limited thereto. A thickness of the insulating layer may be from 10 nm to 10 μm, but is not limited thereto.

Specific materials and formation methods for the organic material layer are not particularly limited, and materials and formation methods widely known in the art may be used.

The organic material layer may be manufactured with fewer layers by using various polymer materials by a solvent process other than a deposition method, for example, a method, such as spin coating, dip coating, doctor blading, screen printing, inkjet printing, or thermal transfer.

The organic material layer may include an emission layer, and have a laminate structure that includes one or more selected from a hole injection layer, a hole transport layer, an electron transport layer, and an electron injection layer.

As a material capable of forming the hole injection layer, in general, a material having a large work function is preferred such that the injection of holes into the organic material layer may be facilitated. Particular examples of the hole injection material include: a metal, such as vanadium, chromium, copper, zinc and gold, or an alloy thereof; a metal oxide, such as a zinc oxide, an indium oxide, an indium tin oxide (ITO), and an indium zinc oxide (IZO); a combination of metal and oxide, such as ZnO:Al or $SnO_2$:Sb; an electrically conductive polymer, such as poly(3-methylthiophene), poly[3,4-(ethylene-1,2-dioxy)thiophene] (PEDT), and polypyrrole and polyaniline, but are not limited thereto.

As a material capable of forming the electron injection layer, in general, a material having a small work function is preferred such that electrons are easily injected into the organic material layer.

Particular examples of the electron injection material include: a metal, such as magnesium, calcium, sodium, potassium, titanium, indium, yttrium, lithium, gadolinium, aluminum, silver, tin, and lead or an alloy thereof; a multi-layered structure material, such as LiF/Al or $LiO_2$/Al, and the same material as the hole injection electrode material may be used, but the examples of the electron injection material are not limited thereto. As a material capable of forming the emission layer, a material, which is capable of emitting light in a visible ray region by receiving holes from the hole transport layer and electrons from the electron transport layer, and combining the holes and the electrons, and has high quantum efficiency for fluorescence or phosphorescence, is preferred. Particular examples thereof include: 8-hydroxy-quinoline-aluminum complex ($Alq_3$); carbazole-based compounds; dimerized styryl compounds; BAlq; 10-hydroxybenzoquinoline-metal compounds; benzoxazole-based, benzthiazole-based and benzimidazole-based compounds; poly(p-phenylenevinylene) (PPV)-based polymers; spiro compounds; polyfluorene and rubrene; phosphorescence host CBP[[4,4'-bis(9-carbazolyl)biphenyl]; and the like, but are not limited thereto.

Further, the light emitting material may additionally include a phosphorescent dopant or a fluorescent dopant in order to improve fluorescent or phosphorescent characteristics. Particular examples of the phosphorescent dopant include ir(ppy)(3) [fac tris(2-phenylpyridine) iridium], and F2Irpic [iridium(III)bis(4,6,-di-fluorophenyl-pyridinato-N, C2) picolinate]. As the fluorescent dopant, those known in the art may be used.

As a material capable of forming the electron transport layer, a material which is capable of receiving electrons from the electron injection layer well and transport the electrons to the emission layer and has high mobility to electrons, is suitable. Particular examples thereof include: a 8-hydroxy-quinoline Al complex; a complex including $Alq_3$; an organic radical compound; a hydroxyflavone metal complex and the like, but are not limited thereto.

The cathode may include one or more of Al, Ag, Ca, Mg, Au, Mo, Ir, Cr, Ti, Pd, and an alloy thereof, but is not limited thereto.

The organic light emitting device according to the present application may be more preferably applied to an organic light emitting device for lighting. Further, the organic light emitting device according to the present application may be more preferably applied to a flexible organic light emitting device.

The organic light emitting device according to the present application may include a light extraction structure. More particularly, a light extracting layer may be additionally included between the substrate and the organic light emitting device.

As long as the light extracting layer has a structure for inducing light scattering and improving light extraction efficiency of the organic light emitting device, the light extracting layer is not particularly limited. More particularly, the light extracting layer may have a structure in which scattering particles are dispersed in a binder.

In addition, the light extracting layer may be directly formed on a base material by a method, such as spin coating, bar coating, and slit coating, or may be formed by a method of preparing the light extracting layer in a film form to be attached onto the base material.

Further, a flattening layer may be additionally included on the light extracting layer.

Further, the present invention provides a display device including the organic light emitting device. The organic light emitting device in the display device may serve as a pixel or a backlight. Configurations known in the art may be applied as the other configurations of the display device.

Further, the present invention provides a lighting device including the organic light emitting device. In the lighting device, the organic light emitting device serves as an emitting unit. Configurations known in the art may be applied as the other configurations necessary for the lighting device.

As described above, the organic light emitting device according to the exemplary embodiment of the present application includes the protecting unit in the region of the region on the thin glass substrate, on which the organic light emitting unit and the encapsulating unit are not provided, and the lateral surface region of the substrate, thereby protecting the thin glass substrate from exposure to the outside, and thus enhancing strength of an organic light emitting device product.

The invention claimed is:

1. An organic light emitting device, comprising:
   a substrate;
   an organic light emitting unit in which a first electrode, an organic material layer, and a second electrode are sequentially stacked on the substrate; and
   an encapsulating unit configured to seal an external side of the organic light emitting unit,
   wherein a protecting unit is provided on at least a partial region of the substrate, on which the organic light emitting unit and the encapsulating unit are not provided, and at least a partial region in a lateral surface region of the substrate, and
   wherein the encapsulating unit comprises a sealing layer which is in contact with the external side of the organic light emitting unit, and a metal layer provided on the sealing layer.

2. The organic light emitting device of claim 1, wherein the substrate is a thin glass substrate.

3. The organic light emitting device of claim 2, wherein a thickness of the thin glass substrate is 0.1 mm or lower.

4. The organic light emitting device of claim 1, wherein the protecting unit is provided over a region of the substrate, on which the organic light emitting unit and the encapsulating unit are not provided, and an entire region of the lateral surface region of the substrate.

5. The organic light emitting device of claim 4, wherein the protecting unit is additionally provided over an entire region of an upper region and a lateral surface region of the encapsulating unit.

6. The organic light emitting device of claim 1, wherein an out coupling film (OCF) having a wider area than that of the substrate is additionally provided under the substrate.

7. The organic light emitting device of claim 6, wherein the substrate having a smaller area than that of the OCF is provided on the OCF, and
   the protecting unit is additionally included on a region of the OCF on which the substrate is not provided.

8. The organic light emitting device of claim 1, wherein the protecting unit comprises a plastic film.

9. The organic light emitting device of claim 1, wherein the protecting unit comprises an insulating layer and a metal pattern layer.

10. The organic light emitting device of claim 9, wherein the protecting unit comprises two-layered insulating layer and a metal pattern layer provided between the two-layered insulating layer.

11. The organic light emitting device of claim 9, wherein the first electrode or the second electrode is electrically connected with an external power source through the metal pattern layer.

12. The organic light emitting device of claim 9, wherein the metal pattern layer comprises a first metal pattern for electrically connecting the first electrode and an external power source.

13. The organic light emitting device of claim 9, wherein the metal pattern layer comprises a second metal pattern for electrically connecting the second electrode and an external power source.

14. The organic light emitting device of claim 1, wherein the organic light emitting device is a flexible organic light emitting device.

15. The organic light emitting device of claim 1, further comprising:
   a light extracting layer between the substrate and the first electrode.

16. The organic light emitting device of claim 15, further comprising:
   a flattening layer on the light extracting layer.

17. A lighting device comprising the organic light emitting device of claim 1.

18. A display device comprising the organic light emitting device of claim 1.

* * * * *